(12) United States Patent
Okubo et al.

(10) Patent No.: US 8,367,276 B2
(45) Date of Patent: Feb. 5, 2013

(54) MASK BLANK AND METHOD OF MANUFACTURING MASK

(75) Inventors: Yasushi Okubo, Shinjuku (JP); Masahiro Hashimoto, Shinjuku (JP); Toshiyuki Suzuki, Shinjuku (JP); Takayuki Ohnishi, Numazu (JP); Hirohito Anze, Numazu (JP); Hitoshi Sunaoshi, Numazu (JP); Takashi Kamikubo, Numazu (JP)

(73) Assignees: Hoya Corporation, Tokyo (JP); Nuflare Technology, Inc., Shizuoka (JP)

( * ) Notice: Subject to any disclaimer, the term of this patent is extended or adjusted under 35 U.S.C. 154(b) by 125 days.

(21) Appl. No.: 12/209,694

(22) Filed: Sep. 12, 2008

(65) Prior Publication Data

US 2009/0075185 A1    Mar. 19, 2009

(30) Foreign Application Priority Data

Sep. 14, 2007  (JP) ................................. 2007-239953

(51) Int. Cl.
  *G03F 1/00* (2012.01)
  *G03F 7/00* (2006.01)
(52) U.S. Cl. ........................................... 430/5; 430/296
(58) Field of Classification Search .............. 430/5, 296, 430/311, 313
  See application file for complete search history.

(56) References Cited

U.S. PATENT DOCUMENTS

| | | | |
|---|---|---|---|
| 5,538,816 A * | 7/1996 | Hashimoto et al. | 430/5 |
| 6,472,107 B1 | 10/2002 | Chan | |
| 6,645,856 B2 * | 11/2003 | Tanaka et al. | 438/671 |
| 7,674,561 B2 | 3/2010 | Kobayashi et al. | |
| 7,972,750 B2 | 7/2011 | Hashimoto | |
| 8,026,024 B2 | 9/2011 | Hashimoto | |
| 2005/0019674 A1 * | 1/2005 | Okubo et al. | 430/5 |
| 2005/0277034 A1 * | 12/2005 | Mitsui | 430/5 |
| 2006/0088774 A1 * | 4/2006 | Yoshikawa et al. | 430/5 |
| 2007/0190459 A1 * | 8/2007 | Hashimoto et al. | 430/270.1 |
| 2007/0212618 A1 * | 9/2007 | Yoshikawa et al. | 430/5 |
| 2007/0212619 A1 * | 9/2007 | Yoshikawa et al. | 430/5 |

FOREIGN PATENT DOCUMENTS

| | | |
|---|---|---|
| JP | 63173051 A | 7/1988 |
| JP | 2003195479 A | 7/2003 |
| JP | 2003195483 A | 7/2003 |
| JP | 2005-062884 A | 3/2005 |
| JP | 2005128516 A | 5/2005 |
| JP | 2007171520 A | 7/2007 |
| JP | 2007271775 A | 10/2007 |
| JP | 2008070799 A | 3/2008 |

OTHER PUBLICATIONS

Japanese Office Action corresponding to Japanese Patent Application No. 2007-239956, dated May 30, 2012.

* cited by examiner

*Primary Examiner* — Jonathan Jelsma
(74) *Attorney, Agent, or Firm* — Sughrue Mion, PLLC

(57) ABSTRACT

A mask blank is formed on a transparent substrate with a light-shielding film of a material mainly containing chromium and is used for obtaining a photomask by forming the light-shielding film into a transfer pattern by lithography using an electron beam writing resist. The mask blank includes a mask layer formed on the light-shielding film for serving as an etching mask in etching that forms the light-shielding film into the transfer pattern. The mask layer is made of a material containing silicon. The mask blank further includes a chromium nitride-based film formed on the mask layer and containing at least chromium and nitrogen.

15 Claims, 8 Drawing Sheets

MASK BLANK AND METHOD OF MANUFACTURING MASK

This application is based upon and claims the benefit of priority from Japanese patent application No. 2007-239953, filed on Sep. 14, 2007, the disclosure of which is incorporated herein in its entirety by reference.

BACKGROUND OF THE INVENTION

This invention relates to a mask (photomask) for use in transferring a fine pattern in the manufacture of semiconductor elements or the like and further relates to a mask blank being a base of such a mask.

With the increase in fineness of circuit patterns of semiconductor elements or the like, the tolerance between designed and measured pattern line widths of photomasks has become much smaller. As the degree of integration of semiconductor integrated circuits has increased, the design rule in the process of manufacturing those circuits has become stricter and more and more stringent demands have been made on the CD (Critical Dimension) uniformity and the CD linearity.

Techniques intended to satisfy such demands are disclosed in, for example, U.S. Pat. No. 6,472,107 (Patent Document 1) and Japanese Unexamined Patent Application Publication (JP-A) No. 2005-62884 (Patent Document 2). The technique disclosed in Patent Document 1 is a method of using a hard mask pattern, instead of a photoresist pattern, in etching a chromium layer for improving the CD uniformity and the CD linearity of a photomask. It is disclosed that use is made of silicon (Si), Ti, TiW, W, TiN, $Si_3N_4$, $SiO_2$, SOG (Spin On Glass), or the like as a substance constituting a hard mask used for forming the hard mask pattern.

The technique disclosed in Patent Document 2 is an improvement of the technique disclosed in Patent Document 1. This technique provides a mask blank comprising a hard mask having an advantage such that, while maintaining the advantage of the above hard mask pattern, since it is more conductive, electron beam writing can be performed well and, further, it can have a large etching selectivity with respect to a chromium light-shielding film. It is disclosed that use is made of Mo, MoSi, MoSiON, or the like as a substance constituting the hard mask.

SUMMARY OF THE INVENTION

However, according to the study by the present inventor, it has been found that the technique described in Patent Document 2 has the following problem. When performing highly accurate exposure using an electron beam writing apparatus, PEC (Proximity Effect Correction), FC (Fogging effect Correction), or the like is carried out according to a pattern layout (exposure pattern density and arrangement). Herein, PEC is a mechanism for correcting a line-width deviation caused by the irradiated electron energy interference occurring between proximate patterns and mainly corrects a micron (μm)-order area deviation. On the other hand, FC is a mechanism for correcting a phenomenon where electrons reflected from a substrate are again reflected by a structural member (the lowermost surface of an electron optical column), facing the substrate, of an exposure apparatus to again expose an area on the order of millimeters (mm) or more like fog.

According to the study by the present inventor, it has been found that when use is made of a hard mask blank, such as the one described in Patent Document 2, in which a hard mask is disposed just under a resist, there is a case where particularly the FC correction amount increases as compared with conventional mask blanks so that the correction is made difficult. That is, because of the increase in FC correction amount, there is a problem that the CD uniformity or the CD linearity of a mask required in the next-generation semiconductor design rule (after DRAM half-pitch 32 nm) cannot be achieved.

This invention aims to solve the above problem and has an object to provide a mask blank that enables satisfactory FC correction and thus the manufacture of a mask excellent in CD uniformity and CD linearity and that comprises a hard mask satisfying requirements for conductivity, etching selectivity to a chromium light-shielding film, and so on, and to further provide a mask manufactured using such a mask blank.

According to the first aspect of this invention, there is provided a mask blank formed on a transparent substrate with a light-shielding film of a material mainly containing chromium and used for obtaining a photomask by forming the light-shielding film into a transfer pattern by lithography using an electron beam writing resist. The mask blank includes a mask layer formed on the light-shielding film for serving as an etching mask in etching that forms the light-shielding film into the transfer pattern, the mask layer made of a material containing silicon; and a chromium nitride-based film formed on the mask layer and containing at least chromium and nitrogen.

According to the second aspect of this invention, there is provided a mask blank according to the first aspect, wherein the chromium nitride-based film has a thickness of 5 nm to 30 nm.

According to the third aspect of this invention, there is provided a mask blank according to the first aspect, wherein the material of the mask layer contains silicon, oxygen, and nitrogen or contains molybdenum, silicon, and oxygen and/or nitrogen.

According to the fourth aspect of this invention, there is provided a mask blank according to the first aspect, further comprising a phase shift film formed between the transparent substrate and the light-shielding film.

According to the fifth aspect of this invention, there is provided a mask blank according to the second aspect, further comprising a phase shift film formed between the transparent substrate and the light-shielding film.

According to the sixth aspect of this invention, there is provided a mask blank according to the third aspect, further comprising a phase shift film formed between the transparent substrate and the light-shielding film.

According to the seventh aspect of this invention, there is provided a mask blank according to the first aspect, further comprising an electron beam writing resist film formed on the chromium nitride-based film.

According to the eighth aspect of this invention, there is provided a mask blank according to the seventh aspect, wherein the electron beam writing resist film has a thickness of 50 nm to 400 nm.

According to the ninth aspect of this invention, there is provided a photomask manufacturing method comprising the steps of: preparing a mask blank comprising a light-shielding film formed on a transparent substrate and made of a material mainly containing chromium, a mask layer formed on the light-shielding film for serving as an etching mask in etching that forms the light-shielding film into a transfer pattern, the mask layer made of a material containing silicon, a chromium nitride-based film formed on the mask layer and containing at least chromium and nitrogen, and an electron beam writing resist film formed on the chromium nitride-based film; applying a pattern writing process and a development process to the electron beam writing resist film to form a resist pattern; dry-etching the chromium nitride-based film using the resist pattern as an etching mask to form a chromium nitride-based film pattern; dry-etching the mask layer using the chromium nitride-based film pattern as an etching mask to form a mask layer pattern; and dry-etching the light-shielding film using the mask layer pattern as an etching mask to form a light-shielding film pattern.

According to the tenth aspect of this invention, there is provided a photomask manufacturing method according to the ninth aspect, wherein the chromium nitride-based film has a thickness of 5 nm to 30 nm.

According to the configuration described above, it is possible to obtain a mask blank that enables satisfactory FC correction and thus the manufacture of a mask excellent in CD uniformity and CD linearity and that comprises a hard mask satisfying requirements for conductivity, etching selectivity to a chromium light-shielding film, and so on, and to further provide a mask manufactured using such a mask blank.

DESCRIPTION OF THE EXEMPLARY EMBODIMENTS

First Embodiment

Figure 1:
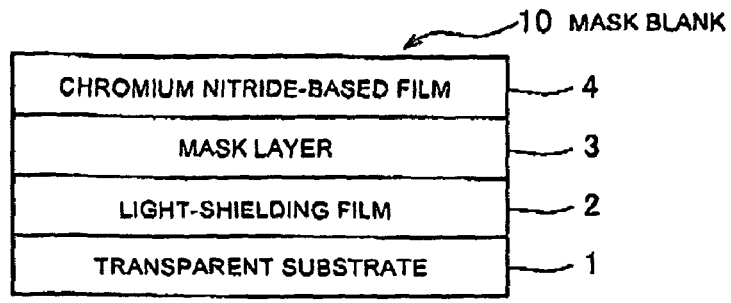
FIG. 1 is an explanatory diagram of a section of a mask blank according to a first embodiment of this invention.

FIG. 1 is an explanatory diagram of a section of a mask blank according to a first embodiment of this invention. In FIG. 1, symbol 10 denotes the mask blank according to this embodiment. The mask blank 10 comprises a transparent substrate 1 and a light-shielding film 2, a mask layer 3, and a chromium nitride-based film 4 that are formed in this order on the transparent substrate 1. The light-shielding film 2 is a film comprising at least one layer made of a material that can be etched with a dry etching gas containing a chlorine gas. The mask layer 3 formed on the light-shielding film 2 is a film having resistance to etching of the light-shielding film 2. For example, the mask layer 3 is a film that can be etched by a dry etching gas containing a fluorine gas while remains during patterning of the light-shielding film 2 so as to serve as an etching mask. On this mask layer 3, there is formed the chromium nitride-based film 4 made of a material containing at least chromium and nitrogen.

The light-shielding film 2 may be a single-layer film or a multilayer film. The light-shielding film 2 may include an antireflection layer at its surface layer portion (upper layer portion). If necessary, the light-shielding film 2 may also have an antireflection layer on the transparent substrate side. The light-shielding film 2 can be made of a material containing chromium, for example, chromium alone or a chromium compound. As the chromium compound, there can be cited, for example, a substance containing chromium and at least one kind of element selected from oxygen, nitrogen, carbon, and fluorine.

The thickness of the light-shielding film 2 is set so that the optical density becomes 2.5 or more with respect to exposure light. For adaptation to pattern miniaturization to the quarter micron level pattern size in recent years, the thickness of the light-shielding film 2 is specifically preferably 90 nm or less. This is because if the thickness exceeds 90 nm, the case is considered where formation of a fine pattern becomes difficult due to microloading or the like during dry etching. By reducing the thickness to some degree, it is possible to achieve a reduction in pattern aspect ratio (ratio of pattern depth to pattern width) and thus to achieve a reduction in global loading and microloading. At an exposure wavelength of 200 nm or less, the light-shielding film 2 in this invention can obtain a required optical density (e.g. 2.5 or more) even if it is formed as a thin film having a thickness of 90 nm or less. With respect to the lower limit of the thickness of the light-shielding film 2, it can be reduced as long as the required optical density can be obtained.

A method of forming the light-shielding film 2 is not particularly limited, but a sputtering film forming method is preferable. By the sputtering film forming method, it is possible to form a thin film with uniform thickness. When forming the light-shielding film 2 on the transparent substrate 1 by the sputtering film forming method, a chromium target can be used as a sputtering target and, as a sputtering gas introduced into a chamber, use can be made of an inert gas such as an argon gas or a helium gas, or a mixture of an inert gas with an oxygen gas, a nitrogen gas, a nitrogen monoxide gas, a carbon dioxide gas, a hydrocarbon gas, or the like.

The mask layer 3 can be made of a material having resistance to etching of the light-shielding film 2. For example, when the light-shielding film 2 is made of a material containing chromium, the mask layer 3 can be made of a material containing silicon. As the material containing silicon, there is, for example, a material containing silicon, oxygen, and nitrogen, or a material containing molybdenum, silicon, and oxygen and/or nitrogen.

The thickness of the mask layer 3 is preferably as thin as possible for achieving an excellent pattern shape of the lower-layer light-shielding film 2 to improve the CD accuracy. For example, when the light-shielding film 2 is made of the material containing chromium and the mask layer 3 is made of the material containing silicon as described above, the thickness of the mask layer 3 is preferably 30 nm or less. The thickness of the mask layer 3 is more preferably 20 nm or less, 15 nm or less, or 10 nm or less. The lower limit of the thickness of the mask layer 3 is set so that the mask layer 3 remains while dry-etching the lower-layer light-shielding film 2 using the mask layer 3 as a mask. Taking these points into account, the thickness of the mask layer 3 is preferably set to 5 nm to 30 nm.

The chromium nitride-based film 4 exhibits an effect of suppressing an increase in FC correction amount when performing electron beam writing (EB writing) of a required pattern on a resist film (specifically, an electron beam writing resist film) that is formed on the chromium nitride-based film 4 in mask fabrication. The chromium nitride-based film 4 is made of a material containing at least chromium and nitrogen and, specifically, use can be made of a chromium nitride film made of chromium and nitrogen, a chromium oxynitride film made of chromium, oxygen, and nitrogen, a chromium carbonitride film made of chromium, carbon, and nitrogen, or a chromium oxycarbonitride film made of chromium, oxygen, carbon, and nitrogen. The chromium nitride-based film 4 can be formed by, for example, sputtering. Specifically, the chromium nitride-based film 4 can be formed by reactive sputtering using a chromium target as a sputtering target in a mixed gas atmosphere containing an inert gas such as an Ar gas or a He gas and an active gas containing a nitrogen-based gas such as a $N_2$ gas, a NO gas, or a $N_2O$ gas. For forming the chromium nitride-based film 4 containing oxygen and/or carbon, the film is formed in a mixed gas atmosphere added with an $O_2$ gas, a $CO_2$ gas, a CO gas, a $CH_4$ gas, or the like as an active gas. The thickness of the chromium nitride-based film 4 is preferably 5 nm or more for suppressing an increase in FC correction amount and is more preferably 10 nm or more or 15 nm or more. The upper limit of the thickness of the chromium nitride-based film 4 is preferably 30 nm or less in terms of improving the pattern shape of the lower-layer mask layer 3 and light-shielding film 2 and improving the CD accuracy.

The mask layer 3 or the chromium nitride-based film 4 can be provided with a function of preventing reflection of exposure light by adjusting the composition thereof and so on. In this case, a light-shielding film pattern of a mask may have a structure in which the mask layer 3 is formed on the light-shielding film 2 or a structure in which the mask layer 3 and the chromium nitride-based film 4 are formed on the light-shielding film 2.

Second Embodiment

Figure 2:
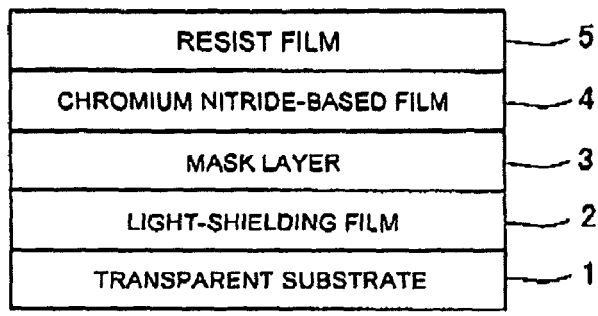
FIG. 2 is an explanatory diagram of a section of a mask blank according to a second embodiment of this invention.

FIG. 2 is an explanatory diagram of a section of a mask blank according to a second embodiment of this invention. The mask blank according to this embodiment has a resist film 5 formed on a chromium nitride-based film 4. The resist film 5 is specifically an electron beam writing resist film. The thickness of the resist film 5 is preferably as thin as possible for achieving high pattern accuracy (CD accuracy) of a light-shielding film 2. Specifically, the thickness of the resist film 5 is preferably 400 nm or less and is more preferably 300 nm or less, 200 nm or less, or 150 nm or less.

The lower limit of the thickness of the resist film 5 is set so that the resist film 5 remains while dry-etching the lower-layer chromium nitride-based film 4 using as an etching mask a resist pattern formed by applying writing and development processes to the resist film 5. Taking these points into account, the thickness of the resist film 5 is preferably set to 50 nm to 400 nm. For achieving high resolution, a material of the resist film 5 is preferably a chemically amplified resist having high resist sensitivity. In this invention, a polyhydroxystyrene-based (hereinafter referred to as "PHS-based") chemically amplified resist is suitable because it is highly effective for an FC amount suppression effect by a chromium oxynitride film during electron beam writing on the resist film.

Third Embodiment

Figure 3:
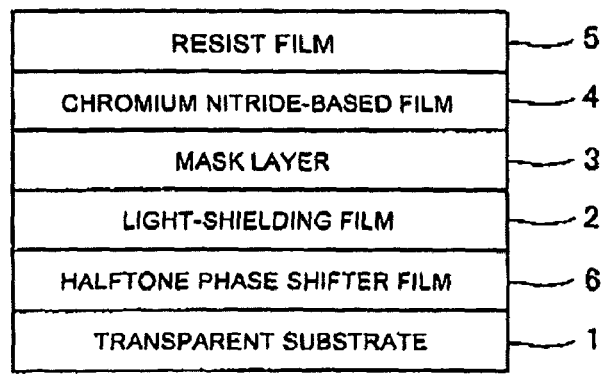
FIG. 3 is an explanatory diagram of a section of a mask blank according to a third embodiment of this invention.

FIG. 3 is an explanatory diagram of a section of a mask blank according to a third embodiment of this invention. The mask blanks according to the foregoing first and second embodiments are each a so-called binary mask blank. However, this invention is also applicable to a mask blank for use in the manufacture of a halftone phase shift mask. The mask blank according to this embodiment shown in FIG. 3 is a mask blank for use in the manufacture of a halftone phase shift mask, wherein a halftone phase shifter film 6 is formed between a transparent substrate 1 and a light-shielding film 2. In this case, it may be configured that a required optical density (e.g. 2.5 or more) is obtained by a combination of the halftone phase shifter film 6 and the light-shielding film 2. In this event, the optical density of the light-shielding film 2 itself can be set to 0.5 or more and, preferably, can be adjusted between 0.5 to 2.5.

The halftone phase shifter film 6 transmits light with an intensity that does not substantially contribute to exposure (e.g. 1% to 30% with respect to an exposure wavelength), thereby producing a predetermined phase difference. The halftone phase shifter film 6 includes light-semitransmissive portions formed by patterning the halftone phase shifter film 6 and light-transmissive portions formed with no halftone phase shifter film 6 and adapted to transmit light with an intensity that substantially contributes to exposure. By configuring so that the phase of the light transmitted through the light-semitransmissive portions is substantially inverted with respect to that of the light transmitted through the light-transmissive portions, the lights having passed near the boundaries between the light-semitransmissive portions and the light-transmissive portions cancel each other due to diffraction. This makes the light intensity at the boundary portions approximately zero to thereby improve the contrast, i.e. the resolution, at the boundary portions.

The halftone phase shifter film 6 is preferably made of a material having an etching selectivity different from that of the light-shielding film 2 formed thereon. As the material of the halftone phase shifter film 6 there can be cited, for example, a metal such as molybdenum, tungsten, tantalum, or hafnium, or a substance mainly containing silicon and oxygen and/or nitrogen. The halftone phase shifter film 6 may be in the form of a single layer or a plurality of layers. The light-shielding film 2 formed on the halftone phase shifter film 6 is configured so that the laminated structure combining the halftone phase shifter film 6 and the light-shielding film 2 provides an optical density of 2.5 or more with respect to exposure light. The thickness of the light-shielding film 2 thus configured is preferably 50 nm or less. This is because, as described before, the case is considered where formation of a fine pattern becomes difficult due to microloading or the like during dry etching.

Hereinbelow, mask blanks according to this invention and masks using those mask blanks, including manufacturing processes thereof, will be described in detail on the basis of Examples.

Example 1

A mask blank 10 of Example 1 comprises a transparent substrate 1 and a light-shielding film 2, a mask layer 3, and a chromium nitride-based film 4 that are formed in this order on the transparent substrate 1 (see FIG. 1). Hereinbelow, the mask blank and a mask according to Example 1 will be described while describing the manufacturing processes thereof. FIGS. 4 to 9 are sectional views illustrating the mask blank according to Example 1 and the mask manufacturing processes using such a mask blank. The mask blank 10 of Example 1 comprises the transparent substrate 1 made of a synthetic quartz glass and having precision-polished main surfaces and end faces, the light-shielding film 2 formed on the transparent substrate 1 and mainly containing chromium, the mask layer 3 made of a material containing silicon, which will serve as an etching mask in patterning the light-shielding film 2, and the chromium nitride-based film 4. By forming these light-shielding film 2, mask layer 3, and chromium nitride-based film 4 by sputtering, the mask blank 10 is fabricated (see FIG. 1).

A manufacturing method of the mask blank 10 and a manufacturing method of a mask 100 using the mask blank 10 will be described in detail hereinbelow. By the use of a single-wafer sputtering apparatus, reactive sputtering was carried out in a mixed gas atmosphere of Ar, $N_2$, and He gases (Ar: 30 vol %, $N_2$: 30 vol %, He: 40 vol %) using a chromium target as a sputtering target, thereby forming a chromium nitride layer made of chromium and nitrogen on the transparent substrate 1.

Then, reactive sputtering was carried out in a mixed gas atmosphere of Ar, $CH_4$, and He gases (Ar: 54 vol %, $CH_4$: 6 vol %, He: 40 vol %), thereby forming a chromium carbonitride layer made of chromium, nitrogen, and carbon. Then, reactive sputtering was carried out in a mixed gas atmosphere of Ar and NO gases (Ar: 90 vol %, NO: 10 vol %), thereby forming a chromium oxynitride layer made of chromium, oxygen, and nitrogen. In this manner, the light-shielding film 2 having an antireflection function at its surface layer was formed. The thickness of the light-shielding film 2 was 67 nm.

Then, the mask layer 3 to serve as an etching mask in patterning the light-shielding film 2 was formed on the light-shielding film 2 using the single-wafer sputtering apparatus. Specifically, reactive sputtering was carried out in a mixed gas atmosphere of Ar and $N_2$ gases (Ar: 10 vol %, $N_2$: 90 vol %) using a target of molybdenum silicide (molybdenum:silicon=10:90 (atomic percent ratio)) as a sputtering target, thereby forming a molybdenum silicide nitride film made of molybdenum, silicon, and nitrogen as the mask layer 3. The thickness of the mask layer 3 was 15 nm.

Then, by the use of the single-wafer sputtering apparatus, reactive sputtering was carried out in a mixed gas atmosphere of Ar and NO gases (Ar: 80 vol %, NO: 20 vol %) using a chromium target as a sputtering target, thereby forming the chromium nitride-based film 4 made of chromium, oxygen, and nitrogen (made of chromium oxynitride) on the mask layer 3. The thickness of the chromium nitride-based film 4 was 10 nm. In this manner, the mask blank 10 was obtained.

Figure 4:
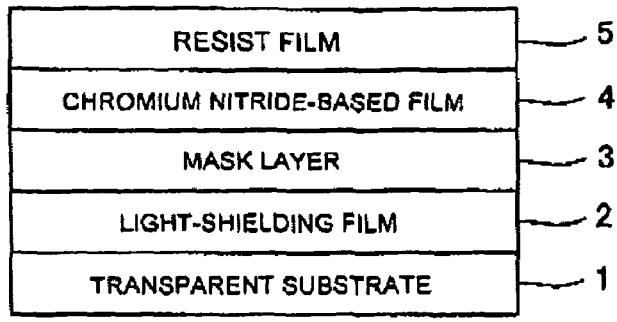
FIG. 4 is an explanatory diagram of a manufacturing process in the manufacture of a mask using a mask blank according to Example 1, which illustrates a state where a resist film 5 is formed on a mask blank 10.

Next, the processes of manufacturing the mask 100 using the obtained mask blank 10 will be described. An electron beam writing resist being a PHS (polyhydroxystyrene)-based chemically amplified resist (CAR:FEP-171 manufactured by FUJI FILM Electronic Materials Co., Ltd.) was spin-coated on the mask blank 10 and then subjected to a heat/drying treatment, thereby forming a resist film 5 having a thickness of 200 nm (FIG. 4).

Figure 5:
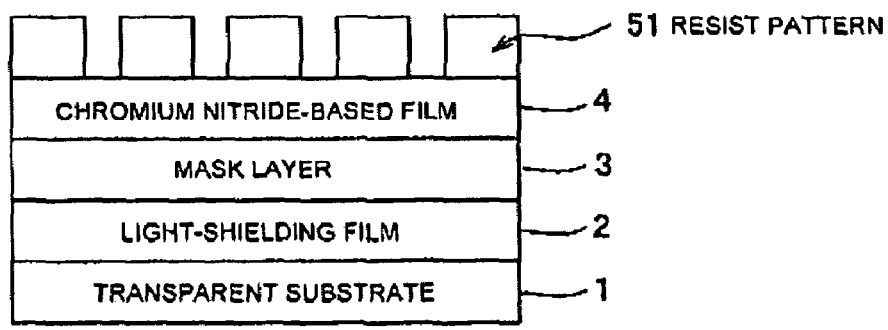
FIG. 5 is an explanatory diagram of a manufacturing process in the manufacture of the mask using the mask blank according to Example 1, which illustrates a state where a resist pattern 51 is formed.

Then, using an electron beam writing apparatus, pattern writing was performed on the resist film 5 formed on the mask blank 10 and, thereafter, development was carried out using a predetermined developer, thereby forming a resist pattern 51 (FIG. 5).

Figure 6:
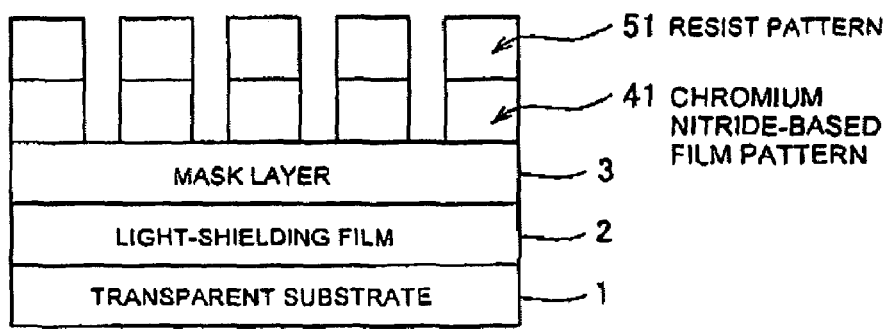
FIG. 6 is an explanatory diagram of a manufacturing process in the manufacture of the mask using the mask blank according to Example 1, which illustrates a state where a chromium nitride-based film pattern 41 is formed using the resist pattern 51 as a mask.

Then, using the resist pattern 51 as an etching mask, dry etching was performed with a dry etching gas in the form of a mixed gas of Cl and $O_2$ gases, thereby forming a chromium nitride-based film pattern 41 (FIG. 6).

Figure 7:
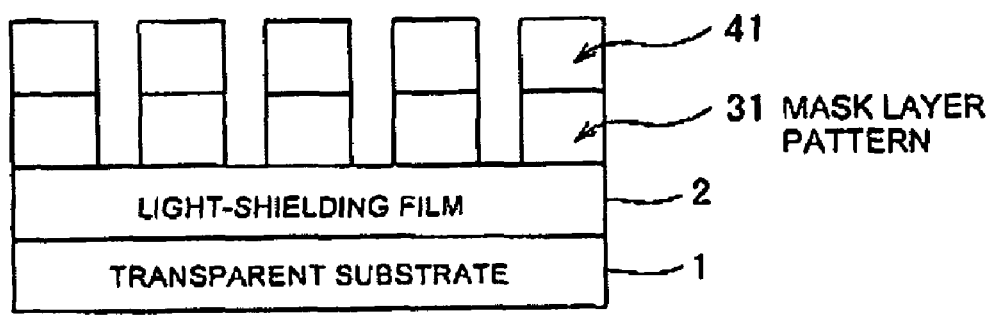
FIG. 7 is an explanatory diagram of a manufacturing process in the manufacture of the mask using the mask blank according to Example 1, which illustrates a state where a mask layer pattern 31 is formed using the chromium nitride-based film pattern 41 as a mask.

Then, the resist pattern 51 was removed by a resist stripping solution and, then, using the chromium nitride-based film pattern 41 as an etching mask, dry etching was performed with a dry etching gas in the form of a mixed gas of $CF_4$ and $O_2$ gases, thereby forming a mask layer pattern 31 being a molybdenum silicide nitride film pattern (FIG. 7).

Figure 8:
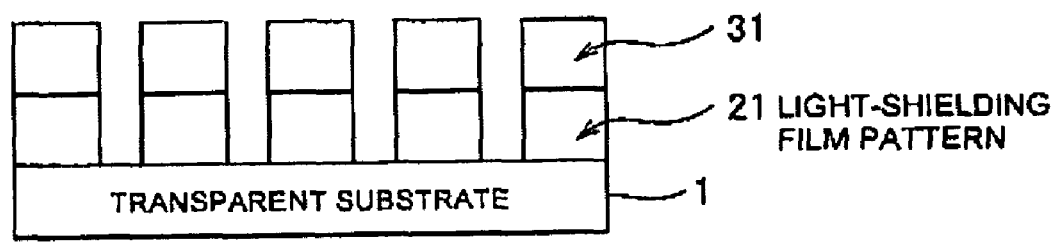
FIG. 8 is an explanatory diagram of a manufacturing process in the manufacture of the mask using the mask blank according to Example 1, which illustrates a state where a light-shielding film pattern 21 is formed using the mask layer pattern 31 as a mask.

Then, using as an etching mask a laminated film pattern comprising the chromium nitride-based film pattern 41 and the mask layer pattern 31, dry etching was performed with a dry etching gas in the form of a mixed gas of Cl and $O_2$ gases, thereby forming a light-shielding film pattern 21 (FIG. 8). The chromium nitride-based film pattern 41 is removed in patterning the light-shielding film 2 and, therefore, only the mask layer pattern 31 being the molybdenum silicide nitride film pattern remains on the light-shielding film pattern 21.

Figure 9:
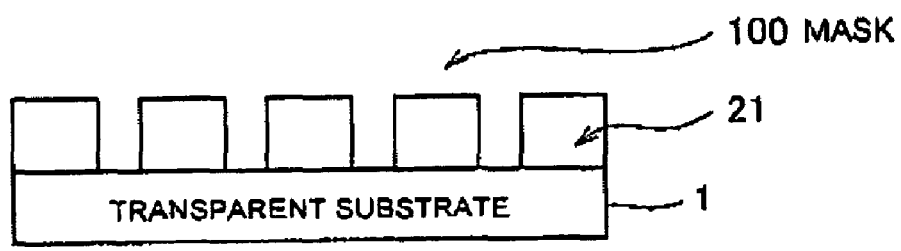
FIG. 9 is an explanatory diagram of a manufacturing process in the manufacture of the mask using the mask blank according to Example 1, which illustrates a state where the mask layer pattern 31 is removed so that there is obtained the mask having the light-shielding film pattern 21 formed on a transparent substrate 1.

Finally, the molybdenum silicide nitride film, i.e. the mask layer pattern 31, remaining on the light-shielding film pattern 21 is removed, thereby obtaining the mask 100 (FIG. 9).

In the obtained mask 100, the light-shielding film pattern 21 on the transparent substrate 1 was formed to comprise isolated space patterns having a plurality of pattern line widths (120 nm to 1600 nm). An evaluation of the obtained mask 100 was performed by deriving as a CD linearity a difference between maximum and minimum values of deviations between designed and measured values of the plurality of pattern line widths of the light-shielding film pattern 21. In the case of the mask of Example 1, a very satisfactory value of 3 nm was obtained as its CD linearity. This value fully satisfies the value of CD linearity required for a mask in the semiconductor design rule of DRAM half-pitch 32 nm.

Example 2

A mask blank 10 and a mask 100 according to Example 2 were fabricated in the same manner as in Example 1 except that the thickness of a chromium nitride-based film 4 was set to 5 nm. The obtained mask was evaluated in the same manner as described above, wherein a satisfactory value of 5 nm was obtained as its CD linearity. This value satisfies the value of CD linearity required for a mask in the semiconductor design rule of DRAM half-pitch 32 nm.

Examples 3 and 4

Mask blanks 10 and masks 100 according to Examples 3 and 4 were fabricated in the same manner as in Example 1 except that a chromium nitride-based film 4 was formed as a chromium nitride film made of chromium and nitrogen (Example 3) and a chromium nitride-based film 4 was formed as a chromium oxycarbonitride film made of chromium, oxygen, carbon, and nitrogen (Example 4). The chromium nitride film of Example 3 was formed by performing reactive sputtering in a mixed gas atmosphere of Ar and $N_2$ gases. The chromium oxycarbonitride film of Example 4 was formed by performing reactive sputtering in a mixed gas atmosphere of Ar, $CO_2$, and $N_2$ gases. The obtained masks were evaluated in the same manner as described above, wherein a satisfactory value of 5 nm was obtained as a CD linearity of each of them. This value satisfies the value of CD linearity required for a mask in the semiconductor design rule of DRAM half-pitch 32 nm.

Examples 5 and 6

Mask blanks 10 and masks 100 according to Examples 5 and 6 were fabricated in the same manner as in Example 1 except that a mask layer 3 was formed as a silicon oxynitride film made of silicon, oxygen, and nitrogen (Example 5) and a mask layer 3 was formed as a molybdenum silicide oxynitride film made of molybdenum, silicon, oxygen, and nitrogen (Example 6). The silicon oxynitride film of Example 5 was formed by performing reactive sputtering in a mixed gas atmosphere of Ar and NO gases (Ar: 20 vol %, NO: 80 vol %) using a silicon target as a sputtering target.

The molybdenum suicide oxynitride film of Example 6 was formed by performing reactive sputtering in a mixed gas atmosphere of Ar and NO gases (Ar: 10 vol %, NO: 90 vol %) using a target of molybdenum silicide (molybdenum:silicon=10:90 (atomic percent ratio)) as a sputtering target.

The obtained masks were evaluated in the same manner as described above, wherein a very satisfactory value of 3 nm was obtained as a CD linearity of each of them. This value fully satisfies the value of CD linearity required for a mask in the semiconductor design rule of DRAM half-pitch 32 nm.

Example 7

A mask blank (phase shift mask blank) was fabricated in the same manner as in Example 1 except that a halftone phase shifter film 6 serving as a phase shift film was formed between a transparent substrate 1 and a light-shielding film 2, and a mask (phase shift mask) was fabricated using this mask blank. Hereinbelow, the mask blank and the mask according to Example 7 will be described, including manufacturing processes thereof. The manufacturing processes are substantially the same as in Example 1 except forming and patterning the halftone phase shifter film 6. Therefore, the processes up to the patterning of the halftone phase shifter film 6 will be described with reference to FIGS. 4 to 9 described above for convenience' sake and the processes for patterning the halftone phase shifter film 6 will be described with reference to FIGS. 10 to 12.

The halftone phase shifter film 6 was formed on the transparent substrate 1 using a single-wafer sputtering apparatus. Specifically, reactive sputtering was carried out in a mixed gas atmosphere of Ar and $N_2$ gases (Ar: 10 vol %, $N_2$: 90 vol %) using a target of molybdenum silicide (molybdenum:silicon=8:92 (atomic percent ratio)) as a sputtering target, thereby forming the halftone phase shifter film 6 in the form of a molybdenum silicide nitride film made of molybdenum, silicon, and nitrogen. The thickness of the halftone phase shifter film 6 was set so as to provide a transmittance of 5.5% and a phase shift of about 180 degrees with respect to ArF excimer laser light (wavelength: 193 nm).

The mask was fabricated in the following manner. At first, as in Example 1, an electron beam writing resist (CAR:FEP-171 manufactured by FUJI FILM Electronic Materials Co., Ltd.) was spin-coated on the mask blank in which the halftone phase shifter film 6, the light-shielding film 2, a mask layer 3, and a chromium nitride-based film 4 were formed on the transparent substrate 1, and then was subjected to a heat/drying treatment, thereby forming a resist film 5 having a thickness of 200 nm (see FIG. 3).

Then, using an electron beam writing apparatus, pattern writing was performed on the resist film 5 formed on the mask blank 10 and, thereafter, development was carried out using a predetermined developer, thereby forming a resist pattern 51 (see FIG. 5).

Then, using the resist pattern 51 as an etching mask, dry etching was performed with a dry etching gas in the form of a mixed gas of Cl and $O_2$ gases, thereby forming a chromium nitride-based film pattern 41 (see FIG. 6).

Then, the resist pattern 51 was removed by a resist stripping solution and, then, using the chromium nitride-based film pattern 41 as an etching mask, dry etching was performed with a dry etching gas in the form of a mixed gas of $CF_4$ and $O_2$ gases, thereby forming a mask layer pattern 31 being a molybdenum suicide nitride film pattern (see FIG. 7).

Then, using as an etching mask a laminated film pattern comprising the chromium nitride-based film pattern 41 and the mask layer pattern 31, dry etching was performed with a dry etching gas in the form of a mixed gas of Cl and $O_2$ gases, thereby forming a light-shielding film pattern 21 (see FIG. 8). The chromium nitride-based film pattern 41 is removed in patterning the light-shielding film 2 and, therefore, only the mask layer pattern 31 being the molybdenum silicide nitride film pattern remains on the light-shielding film pattern 21.

Figure 10:
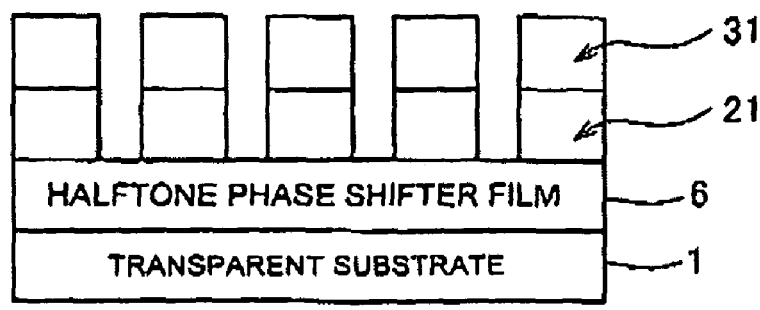
FIG. 10 is an explanatory diagram of a manufacturing process in the manufacture of a mask using a mask blank according to Example 7, which illustrates a state where a light-shielding film pattern 21 and a mask layer pattern 31 are formed on a halftone phase shifter film 6.

FIG. 10 is a diagram illustrating a state where the light-shielding film pattern 21 and the mask layer pattern 31 are formed on the halftone phase shifter film 6 in the manufacture of the mask using the mask blank according to Example 7.

Figure 11:
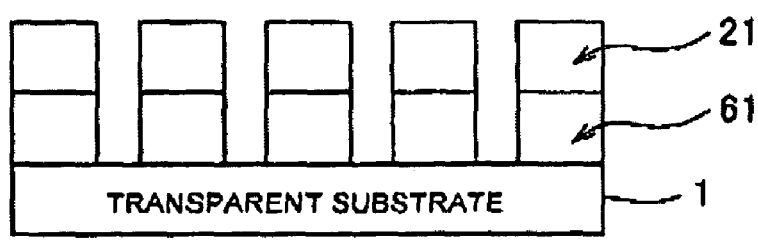
FIG. 11 is an explanatory diagram of a manufacturing process in the manufacture of the mask using the mask blank according to Example 7, which illustrates a state where a phase shifter film pattern 61 is formed by dry etching using as a mask a laminated film pattern comprising the mask layer pattern 31 and the light-shielding film pattern 21.
Figure 12:
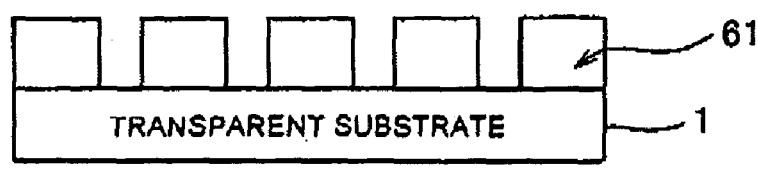
FIG. 12 is an explanatory diagram of a manufacturing process in the manufacture of the mask using the mask blank according to Example 7, which illustrates a state where the mask (phase shift mask) is obtained by removing the unnecessary light-shielding film pattern 21.

Then, using as an etching mask a laminated film pattern comprising the mask layer pattern 31 and the light-shielding film pattern 21, dry etching was performed with a dry etching gas in the form of a mixed gas of $CF_4$ and $O_2$ gases, thereby forming a phase shifter film pattern 61 (see FIG. 11). The mask layer pattern 31 was removed in patterning the phase shifter film 6. Finally, the light-shielding film pattern 21 was left remaining at necessary portions while was removed at unnecessary portions, thereby obtaining the mask (phase shift mask) (see FIG. 12).

The phase shifter film pattern 61 of the obtained mask was evaluated in the same manner as described above, wherein a very satisfactory value of 3 nm was obtained as its CD linearity. This value fully satisfies the value of CD linearity required for a mask in the semiconductor design rule of DRAM half-pitch 32 nm.

Comparative Example

A mask blank and a mask were fabricated in the same manner as in Example 1 except that the chromium nitride-based film 4 was not formed. The obtained mask was evaluated in the same manner as described above, wherein the CD linearity was 7 nm and thus does not satisfy the value of CD linearity required for a mask in the semiconductor design rule of DRAM half-pitch 32 nm.

Figure 13:
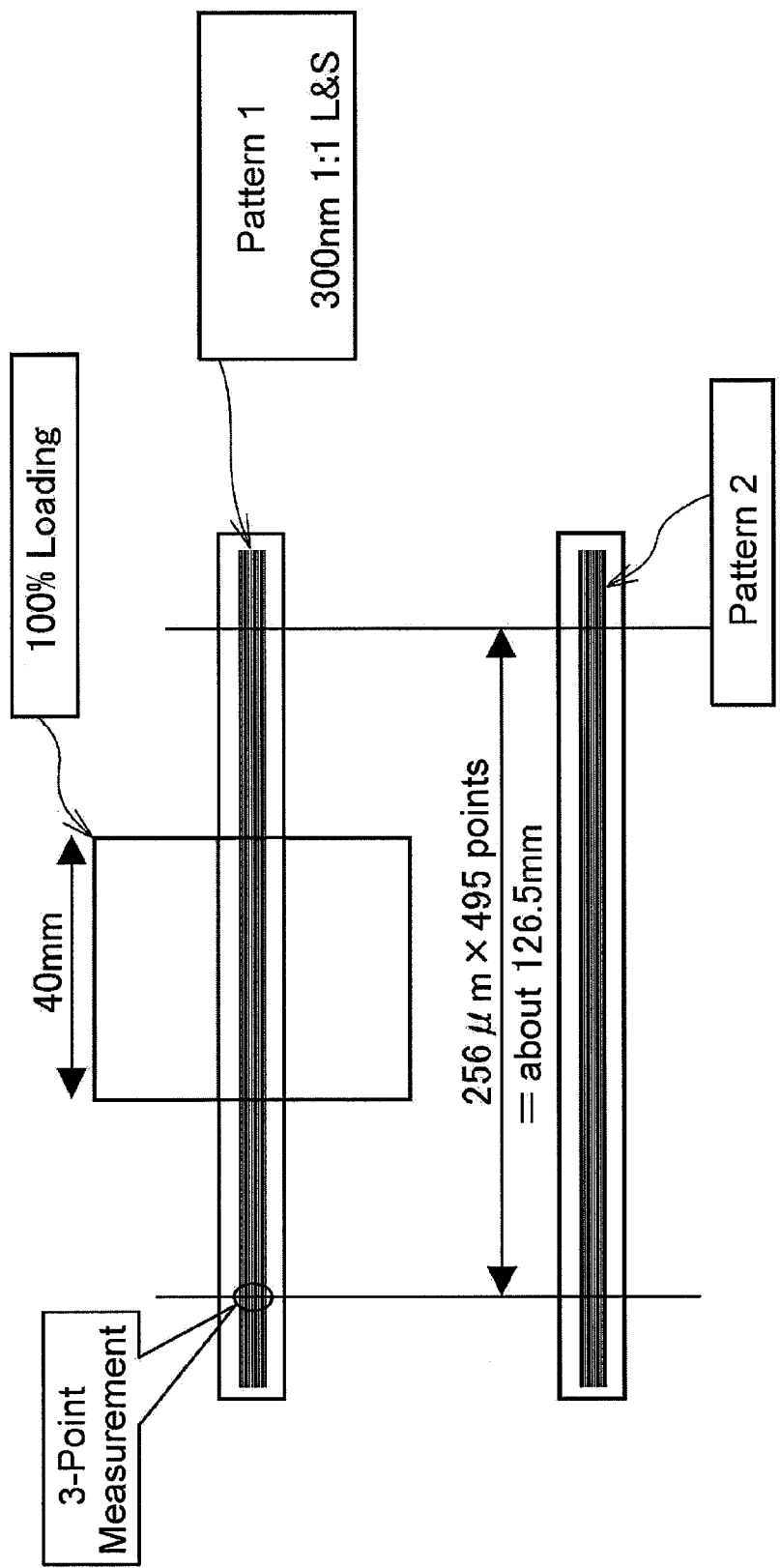
FIG. 13 is an explanatory diagram of an FC amount measuring method.
Figure 14:
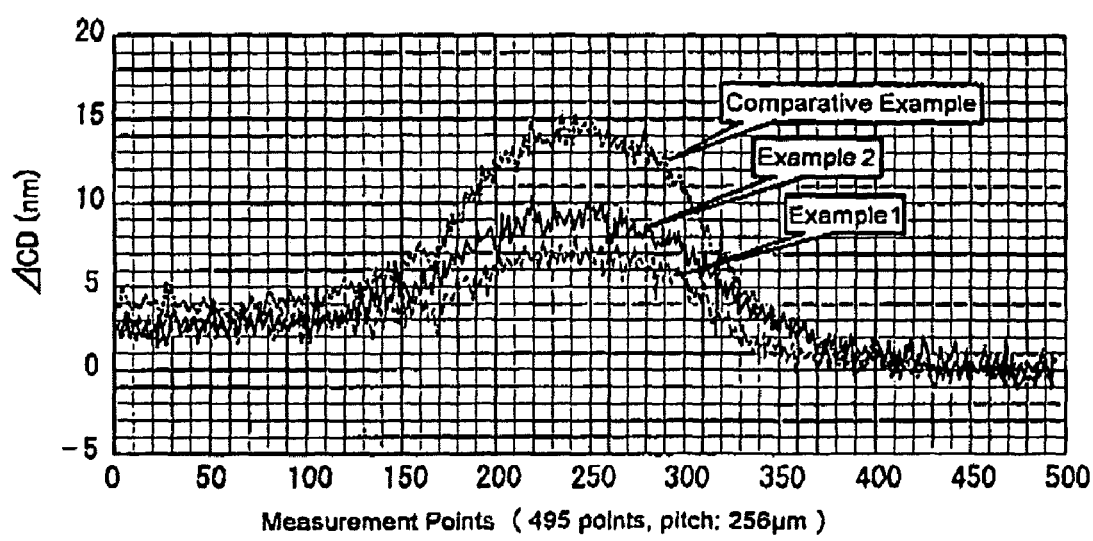
FIG. 14 is a graph in which differences ($\Delta CD$) between line width measured values of patterns 1 and 2 corresponding to respective measurement points in FIG. 13 are derived per type of film under the resist.
Figure 15:
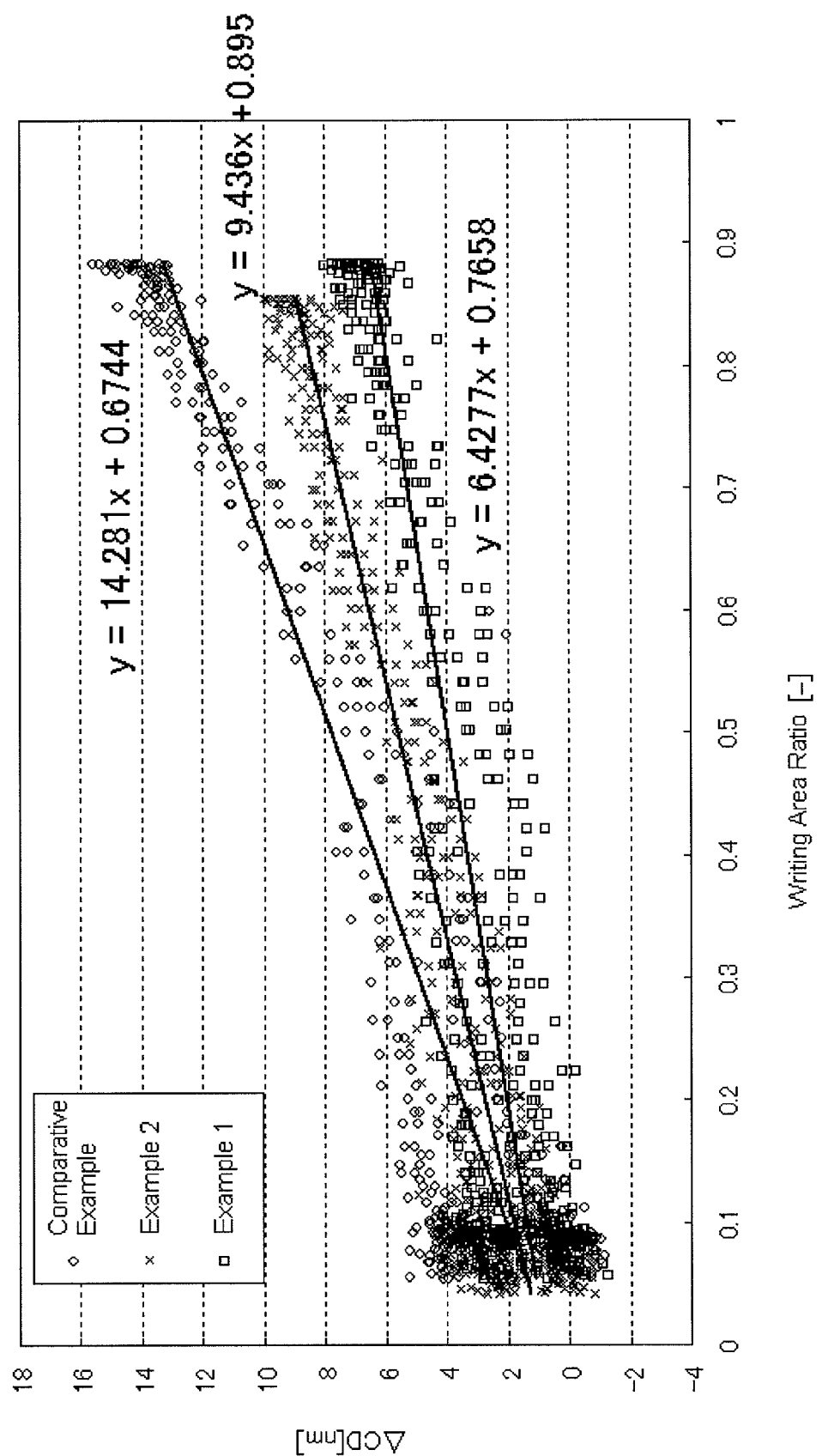
FIG. 15 is a graph for deriving the degree of change in $\Delta CD$ with respect to the writing area ratio, i.e. deriving an FC amount, per type of film under the resist.
Figure 16:
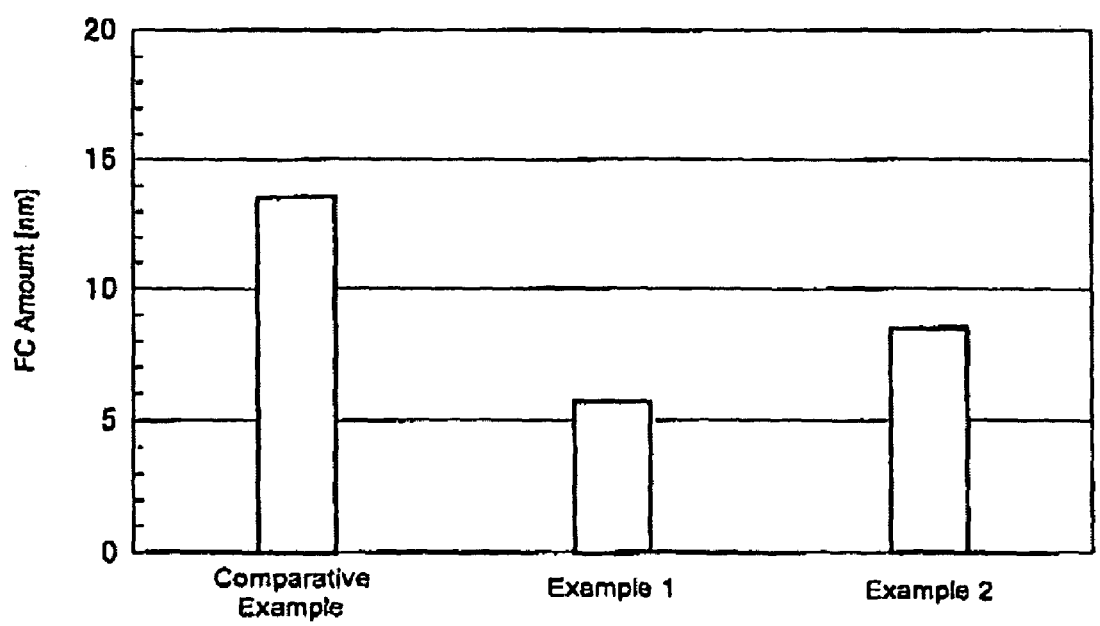
FIG. 16 is a graph showing the FC amounts of Examples 1 and 2 and Comparative Example.

Next, the results of FC amount verification performed for Examples 1 and 2 and Comparative Example described above will be described with reference to FIGS. 13 to 16. FIG. 13 is an explanatory diagram of an FC amount measuring method, FIG. 14 is a graph in which differences (ΔCD) between line width measured values of patterns 1 and 2 corresponding to respective measurement points in FIG. 13 are derived per type of film under the resist, FIG. 15 is a graph for deriving the degree of change in ΔCD with respect to the writing area ratio, i.e. deriving an FC amount, per type of film under the resist, and FIG. 16 is a graph showing the FC amounts of Examples 1 and 2 and Comparative Example.

Herein, the FC amount is defined as a CD error value caused by the fogging effect and is derived in the following manner.

(a) As illustrated in FIG. 13, with respect to each of the resist-film-coated mask blanks in which the resist films are respectively formed on the mask blanks of Examples 1 and 2 and Comparative Example, there is formed a resist pattern comprising the identically designed patterns 1 and 2 (each being a line and space pattern (hereinafter referred to as an "L & S") having a line width of 300 nm and extending laterally in FIG. 13) and a 100% solid pattern having a width of 40 mm and provided on both sides (upper and lower sides in FIG. 13) of the pattern 1 at its central portion. The resist pattern is formed by performing electron beam writing of a layout test pattern and applying a development process thereto.

(b) The L & S width of each of the patterns 1 and 2 is measured at 495 measurement points at a pitch of 256 μm (over a length of about 126.5 mm). In this event, three-point measurement of the L & S width is carried out at each of the measurement points.

(c) The average value of the three-point measurement is derived at each of the 495 measurement points for each of the patterns 1 and 2, thereby deriving a difference (ΔCD) between the line width measured values of the patterns 1 and 2 corresponding to each of the measurement points. This makes it possible to eliminate a contribution of CD distribution caused by the development process and thus to derive a pure FC amount.

(d) The differences (ΔCD) are derived per type of film under the resist, i.e. per type of film formed just under the resist (FIG. 14).

(e) The writing area ratio within a fogging effect influence radius (a value of σ (standard deviation) obtained by fitting FIG. 14 with an error function) is calculated at each of the measurement points, wherein the writing area ratio is a ratio of an area irradiated with an electron beam within the fogging effect influence radius.

(f) A graph is prepared with an axis of abscissas representing the writing area ratio and an axis of ordinates representing ΔCD and the slope of the linear approximation is derived as an FC amount (FIG. 15).

(g) The FC amount is derived per type of film under the resist (FIG. 16).

As shown in FIG. 16, it is seen that the FC amount is clearly smaller in each of Examples 1 and 2 than in Comparative Example. This FC amount in each of Examples 1 and 2 fully enables FC correction in resist pattern formation and thus makes it possible to form a mask excellent in CD uniformity and CD linearity.

This invention is widely applicable to the manufacture of semiconductor elements or the like as a mask for use in fine pattern transfer in lithography or the like and as a mask blank being a base of such a mask.

This invention is not limited to the embodiments and Examples described above and various modifications and changes can be made without departing from the gist and scope of this invention.

What is claimed is:

1. A photomask manufacturing method comprising the steps of:
    preparing a mask blank comprising a transparent substrate, a light-shielding film formed on said transparent substrate and made of a material mainly containing chromium and including an antireflection layer at an upper layer thereof, and having a thickness of 90 nm or less and an optical density which is equal to 2.5 or more with respect to exposure light having a wavelength of 200 nm or less, a mask layer formed on said antireflection layer of said light-shielding film and having a thickness of 5 nm to 20 nm for serving as an etching mask in etching that forms said light-shielding film into a transfer pattern, said mask layer made of a material containing silicon, a chromium nitride-based film formed on said mask layer and containing at least chromium and nitrogen, and an electron beam writing resist film formed on said chromium nitride-based film;
    applying a pattern writing process and a development process to said electron beam writing resist film to form a resist pattern;
    dry-etching said chromium nitride-based film by a dry etching gas containing chlorine gas using said resist pattern as an etching mask to form a chromium nitride-based film pattern;
    dry-etching said mask layer by a dry etching gas containing fluorine gas using said chromium nitride-based film pattern as an etching mask to form a mask layer pattern;
    dry-etching said light-shielding film by a dry etching gas containing chlorine gas using said mask layer pattern as an etching mask to form a light-shielding film pattern including said antireflection layer at an upper portion thereof and to remove said chromium nitride-based film pattern simultaneously; and
    removing said mask layer pattern.

2. A photomask manufacturing method according to claim 1, wherein said chromium nitride-based film has a thickness of 5 nm to 30 nm.

3. A photomask manufacturing method according to claim 1, wherein said antireflection layer of said light-shielding film functions due to removal of said mask layer and said chromium nitride-based film when used as a photomask.

4. A photomask manufacturing method according to claim 1, wherein said chromium nitride-based film is selected from a group of a chromium nitride film made of chromium and nitrogen, a chromium oxynitride film made of chromium, oxygen, and nitrogen, a chromium carbonitride film made of chromium, carbon, and nitrogen, and a chromium oxycarbonitride film made of chromium, oxygen, carbon, and nitrogen.

5. A photomask manufacturing method according to claim 1, wherein said mask layer is made of a material containing silicon, oxygen, and nitrogen, or a material containing molybdenum, silicon, and oxygen and/or nitrogen.

6. A photomask manufacturing method according to claim 1, wherein said mask layer has a thickness of 5 nm to 15 nm.

7. A photomask manufacturing method according to claim 1, wherein said electron beam writing resist film has a thickness of 50 nm to 200 nm.

8. A photomask manufacturing method according to claim 1, wherein said electron beam writing resist film comprises a polyhydroxystyrene-based chemically amplified resist.

9. A photomask manufacturing method comprising the steps of:
preparing a mask blank comprising a transparent substrate, an phase shift film formed on said transparent substrate, a light-shielding film formed on said phase shift film and made of a material mainly containing chromium and including an antireflection layer at an upper layer thereof, and having a thickness of 90 nm or less and an optical density which is equal to 2.5 or more together with that of said phase shift film with respect to exposure light having a wavelength of 200 nm or less, a mask layer formed on said antireflection layer of said light-shielding film and having a thickness of 5 nm to 20 nm for serving as an etching mask in etching that forms said light-shielding film into a transfer pattern, said mask layer made of a material containing silicon, a chromium nitride-based film formed on said mask layer and containing at least chromium and nitrogen, and an electron beam writing resist film formed on said chromium nitride-based film;
applying a pattern writing process and a development process to said electron beam writing resist film to form a resist pattern;
dry-etching said chromium nitride-based film by a dry etching gas containing chlorine gas using said resist pattern as an etching mask to form a chromium nitride-based film pattern;
dry-etching said mask layer by a dry etching gas containing fluorine gas using said chromium nitride-based film pattern as an etching mask to form a mask layer pattern;
dry-etching said light-shielding film by a dry etching gas containing chlorine gas using said mask layer pattern as an etching mask to form a light-shielding film pattern including said antireflection layer at an upper portion thereof and to remove said chromium nitride-based film pattern simultaneously; and
dry-etching said phase shift film by a dry etching gas containing fluorine gas using said mask layer pattern and said light-shielding film pattern as an etching mask to form a phase shift film pattern and to remove said mask layer pattern simultaneously.

10. A photomask manufacturing method according to claim 9, wherein said chromium nitride-based film has a thickness of 5 nm to 30 nm.

11. A photomask manufacturing method according to claim 9, wherein said chromium nitride-based film is selected from a group of a chromium nitride film made of chromium and nitrogen, a chromium oxynitride film made of chromium, oxygen, and nitrogen, a chromium carbonitride film made of chromium, carbon, and nitrogen, and a chromium oxycarbonitride film made of chromium, oxygen, carbon, and nitrogen.

12. A photomask manufacturing method according to claim 9, wherein said mask layer is made of a material containing silicon, oxygen, and nitrogen, or a material containing molybdenum, silicon, and oxygen and/or nitrogen.

13. A photomask manufacturing method according to claim 9, wherein said mask layer has a thickness of 5 nm to 15 nm.

14. A photomask manufacturing method according to claim 9, wherein said electron beam writing resist film has a thickness of 50 nm to 200 nm.

15. A photomask manufacturing method according to claim 9, wherein said electron beam writing resist film comprises a polyhydroxystyrene-based chemically amplified resist.

* * * * *